United States Patent
Ortler et al.

(10) Patent No.: US 7,313,492 B2
(45) Date of Patent: Dec. 25, 2007

(54) METHOD AND DEVICE FOR INCREASING THE DYNAMIC RANGE AND MEASURING ACCURACY OF A MEASURING DEVICE FOR SPECTRUM AND/OR NETWORK ANALYSIS

(75) Inventors: Georg Ortler, Gessertshausen (DE); Elisabeth Satzger, Munich (DE); Christian Evers, Kirchheim (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 11/098,355

(22) Filed: Apr. 4, 2005

(65) Prior Publication Data

US 2005/0222788 A1 Oct. 6, 2005

(30) Foreign Application Priority Data

Apr. 5, 2004 (DE) ............... 10 2004 016 716
Oct. 19, 2004 (DE) ............... 10 2004 050 912

(51) Int. Cl.
*G01R 23/16* (2006.01)
*G01R 23/14* (2006.01)

(52) U.S. Cl. ........................ 702/76; 324/76.23

(58) Field of Classification Search .......... 702/76, 702/77; 324/76.27, 76.23, 76.19, 76.22, 324/76.28, 76.29, 612–613, 628

See application file for complete search history.

(56) References Cited

U.S. PATENT DOCUMENTS

| | | | | |
|---|---|---|---|---|
| 2,954,465 | A | * 9/1960 | White | 324/76.27 |
| 4,791,577 | A | 12/1988 | Winter | 702/77 |
| 5,075,619 | A | * 12/1991 | Said | 324/76.31 |
| 5,300,878 | A | * 4/1994 | Wardle et al. | 324/76.27 |
| 5,550,747 | A | * 8/1996 | Newman, Jr. | 702/76 |
| 5,736,845 | A | 4/1998 | Kosuge | 324/76.27 |
| 5,818,215 | A | * 10/1998 | Miyamae et al. | 324/76.27 |

(Continued)

FOREIGN PATENT DOCUMENTS

DE 195 42 247 C2 5/1996

(Continued)

OTHER PUBLICATIONS

Hill et al., A Frequency Conversion Scheme for an Advanced Portable Microwave Spectrum Analyzer, 1990 IEEE, pp. 447-450.*

(Continued)

*Primary Examiner*—Bryan Bui
*Assistant Examiner*—Toan M. Le
(74) *Attorney, Agent, or Firm*—Marshall, Gerstein & Borun LLP

(57) ABSTRACT

A method and a device for increasing the dynamic range and measuring accuracy of a measuring device for spectrum and/or network analysis images a high-frequency electronic signal within a frequency range into at least two spectra through a first frequency translation by means of a mixer of the measuring device. As a result of the first frequency translation, the spectrum of the high-frequency electronic signal is successively imaged within the resolution bandwidth ($\Delta F_{ZF}$) of an intermediate frequency filter of the measuring device. At the same time, through a second frequency translation, every spectral line of interference signals generated in the measuring device comes to be disposed outside the resolution bandwidth ($\Delta F_{ZF}$) of the intermediate frequency filter.

4 Claims, 5 Drawing Sheets

U.S. PATENT DOCUMENTS

| | | | |
|---|---|---|---|
| 5,869,950 A * | 2/1999 | Hoffman et al. | 320/103 |
| 5,939,887 A * | 8/1999 | Schmidt et al. | 324/628 |
| 6,191,571 B1 * | 2/2001 | Fukui et al. | 324/76.26 |
| 6,229,316 B1 * | 5/2001 | Fukui et al. | 324/624 |
| 6,265,861 B1 * | 7/2001 | Musha | 324/76.23 |
| 6,316,928 B1 * | 11/2001 | Miyauchi | 324/76.27 |
| 6,359,429 B1 * | 3/2002 | Arai et al. | 324/76.23 |
| 6,621,277 B2 * | 9/2003 | Mar | 324/622 |
| 6,631,341 B2 * | 10/2003 | Kameda et al. | 702/124 |
| 6,806,746 B1 * | 10/2004 | Mar | 327/105 |
| 6,861,833 B2 * | 3/2005 | Miyauchi | 324/76.19 |

FOREIGN PATENT DOCUMENTS

| | | |
|---|---|---|
| EP | 841 569 A2 | 5/1998 |
| EP | 841 569 A3 | 5/1998 |

OTHER PUBLICATIONS

Nesimoglu et al., Mixer Linearization for Software Defined Radio Applications, 2002 IEEE, pp. 534-538.*

* cited by examiner

METHOD AND DEVICE FOR INCREASING THE DYNAMIC RANGE AND MEASURING ACCURACY OF A MEASURING DEVICE FOR SPECTRUM AND/OR NETWORK ANALYSIS

BACKGROUND OF THE DISCLOSURE

1. Field of the Invention

The disclosure relates to a method and a device for increasing the dynamic range and measuring accuracy of a measuring device for spectrum and/or network analysis of high frequency signals.

2. Related Technology

In measuring devices for spectrum analysis and/or network analysis of high-frequency electronic signals, for example, spectrum analyzers or network analyzers, which operate according to the principle of superimposition, the high-frequency measuring and generator signals are frequency-translated through mixers from the high-frequency range into the intermediate-frequency range. In this context, the entire relevant high-frequency range is imaged into the intermediate-frequency range for further analysis by tuning the mixer with a variable-frequency mixer signal of a local oscillator.

Alongside its frequency bandwidth and frequency resolution, the performance capability of a measuring device of this kind is characterized primarily by the dynamic range it can realise. The dynamic range results from the capability of the measuring device to measure and present at the same time signals with very low power in the presence of signals with very high power. The dynamic range of a measuring device of this kind is narrowed by interference signals, which are undesirably superimposed within the measuring device either over the measuring signal to be analyzed or over the generator signal to be generated.

These system-specific interference signals are attributable to different interference sources. A considerable interference factor is provided by noise—phase noise from the local oscillator, noise from the receiver stage and the mixer, which, in fact, provides a comparatively low interference level, but is more difficult to compensate because of its stochastic character. A further important interference source is presented by nonlinear functional units in the measuring device—mixers and analog-to-digital converters, which lead to nonlinear distortions of the measuring and generator signal recognizable in additional spectral lines within the frequency range to be analyzed. Finally, the useful signals—measuring signals to be analyzed and generator signals to be generated—are contaminated by high-frequency signals generated in the measuring device—reference frequencies, clock frequencies and network frequencies, which are coupled into the signal paths of the measuring signal or generator signal to be mixed down into the intermediate-frequency range or the signal paths of the mixer signal. Moreover, this high-frequency interference is not adequately attenuated by the filters integrated in the individual signal paths, because these paths are generally very broad-band in design for various reasons, such as the high dynamic requirement of the phase-control loops and the high threshold frequency of the mixer signal.

In principle, a distinction can be made between interference signals, of which, at the frequencies Fzi according to FIG. 1, each spectral line provides a fixed frequency spacing $\Delta f$ relative to the frequency $F_{LO}$ of the mixer signal; and interference signals, of which the spectrum according to FIG. 2 is absolutely fixed and independent of the frequency $F_{LO}$ of the mixer signal. The first group of interference signals includes, for example, coupled high-frequency signals, which modulate the mixer signal in the mixer, or the spectral components of the higher-order intermodulation products generated by nonlinear distortion. The second group of interference signals includes, for example, high-frequency signals of the frequency divider integrated in the individual signal paths of the measuring and generator signals coupled at the output of the mixer.

In order to improve the dynamic range of a measuring device of this kind, these system-specific interference signals must be separated within the frequency range to be analyzed from the useful signals—measuring signals to be analyzed and generator signals to be generated and/or completely removed from the frequency range to be analyzed.

In the spectrum analyzer described in EP 0 841 569 B1, a measuring signal to be analyzed is mixed in several measurements by means of a mixer into several frequency ranges, which are frequency-translated relative to one another, converted by an analog/digital converter and then supplied to a Fourier transformation. Alongside the useful-signal spectral components frequency-translated by the relevant mixer frequency, the individual spectra obtained from the Fourier transformation also contain the interference-signal spectral components generated, for example, in the mixer or in the analog-to-digital converter, which are not subjected to any frequency translation. In a frequency-translation unit, all of the individual spectra generated in the Fourier transformation are then translated back by the frequency value, with which they were frequency-translated in the mixer. If the spectra frequency-translated in this manner are averaged with reference to frequency unit in an averaging unit, then the useful-signal spectral components will be retained because of their identical frequency position in the individual spectra, while the interference-signal spectral components are attenuated because of their statistical distribution in the individual spectra.

The disadvantage with this spectrum analyzer is the fact that the interference-signal spectral components are only attenuated by the averaging unit, but are not removed from the frequency range to be analyzed.

The switching arrangement of U.S. Pat. No. 4,791,577 also provides a frequency translation of the measuring signal to be analyzed into several frequency ranges—in this case, two frequency ranges—in a mixer, a subsequent analog-to-digital conversion of each frequency-translated measuring signal and a generation of the spectrum belonging to the relevant frequency-translated measuring signal through a Fourier transformation. The two spectra of the differently frequency-translated measuring signal are transferred back via a shift register into an identical frequency position, in which the useful-signal spectral components of the two spectra come to be disposed at identical frequencies, while the interference-signal spectral components of the two spectra are disposed at different frequencies. The switching arrangement of U.S. Pat. No. 4,791,577, differs from the arrangement of EP 0 841 569 B1, in that, by comparing the two spectra, the comparator generates a new spectrum, which now contains only useful-signal spectral components but no interference-signal spectral components.

The switching arrangement of U.S. Pat. No. 4,791,577 provides the disadvantage that the interference-signal spectral components in the spectrum of the measuring signal to be analyzed are blanked out only with the frequency resolution of the Fourier transformation. In this arrangement, interference-signal spectral components, which have a frequency spacing relative to the useful-signal spectral components, which is smaller than this frequency resolution, are superimposed over the useful-signal spectral components and, in the comparator, lead to an erroneous blanking out of the relevant useful-signal and interference-signal spectral component.

GENERAL DESCRIPTION

The disclosure provides a method and a device for measuring devices for spectrum and/or network analysis of high-frequency electronic signals, with which all interference-signal spectral components generated in the measuring device, especially interference-signal spectral components at a frequency close to the useful-signal spectral components within the frequency range to be analyzed, are not only attenuated but almost completely removed from the frequency range to be analyzed in order to increase the dynamic range and the measuring accuracy of the measuring device.

The disclosure provides a method for increasing the dynamic range and measuring accuracy of a measuring device for spectrum and/or network analysis of a high-frequency electronic signal and a device for increasing the dynamic range and measuring accuracy of a measuring device for spectrum and/or network analysis of a high-frequency electronic signal.

More specifically, the disclosure provides a method for increasing the dynamic range and measuring accuracy of a measuring device for spectrum and/or network analysis of an electronic high-frequency signal within a frequency range, which implements a first frequency translation by means of a mixer, wherein, through the first frequency translation, the spectrum of the high-frequency electronic signal is imaged successively within the resolution bandwidth ($\Delta F_{ZF}$) of an intermediate frequency filter of the measuring device, wherein, through a second frequency translation, every spectral line of interference signals generated in the measuring device is displaced out of the resolution bandwidth ($\Delta F_{ZF}$) of the intermediate frequency filter.

The disclosure also provides a device for increasing the dynamic range and measuring accuracy of a measuring device for spectrum and/or network analysis of a high-frequency electronic signal within a given the frequency range, which is imaged through a first frequency translation by a mixer of the measuring device successively into the resolution bandwidth ($\Delta F_{ZF}$) of an intermediate filter (24) of the measuring device, wherein the device contains a unit for controlling a second frequency translation.

For the spectrum and/or network analysis of high-frequency electronic signals with a high frequency resolution, instead of a Fourier transformation of the measuring signal to be analyzed into the frequency range and subsequent spectrum analysis in the frequency range, a successive frequency translation—sweeping—of the measuring signal to be analyzed into the resolution bandwidth of an intermediate-frequency filter is implemented by means of mixers. In this manner, the resolution of the spectrum and/or network analysis can be determined by the resolution bandwidth.

With the disclosed method and device, if one of the spectral components of interference signals generated in the measuring device enters the resolution bandwidth of the intermediate-frequency filter, the spectral line of the relevant interference signal is displaced back out of the resolution bandwidth of the intermediate frequency filter by a second frequency translation and does not lead to an undesirable contamination of the frequency range to be analyzed. In exactly the same manner, interference signals generated in the measuring device can be removed from generator signals generated in a measuring device for measuring purposes. Accordingly, measuring and/or generator signals with spectral components of a level smaller than the signal level of the interference-signal spectral components can also be analyzed and/or generated with the measuring device, and a measuring device with increased dynamic range and increased measuring accuracy can therefore be realized.

Dependent upon the interference source of the interference signals, the spectral components of the interference signals can be displaced out of the resolution bandwidth of the intermediate-frequency filter differently:

In the case of interference signals, of which the spectral components provide a fixed frequency spacing relative to the mixer frequency $F_{LO}$ of the mixer signal, these spectral components can be displaced out of the resolution bandwidth of the intermediate frequency filter relatively simply by frequency translation of the mixer frequency $F_{LO}$.

The same effect is achieved, if the mid-frequency $F_M$ of the intermediate-frequency filter is displaced, instead of displacing the mixer frequency $F_{LO}$ of the mixer signal. By reducing the resolution bandwidth $\Delta F_{ZF}$ of the intermediate-frequency filter, it is also possible to cause spectral components of the interference signals to disappear from the resolution bandwidth of the intermediate frequency filter.

Finally, spectral components of interference signals, which are fixed at a given frequency Fzi completely independently of the mixer frequency $F_{LO}$ of the mixer signal, can be displaced out of the resolution bandwidth of the intermediate-frequency filter. In this case, high-frequency signals of reference frequencies, clock frequencies and network frequencies generated in the measuring device, which are coupled into the signal paths of the mixing signal, the generator signal or the carrier signal are involved; the frequency of these signals can be changed by means of frequency dividers integrated in the signal paths by a temporary change of the division factor, thereby displacing them out of the resolution bandwidth of the intermediate frequency filter. In this context, to avoid changing the frequency of the measuring or generator signal, the division factor in the relevant frequency divider should be switched periodically between two values, which are disposed symmetrically relative to the division-factor value required for the frequency division of the measuring signal to be analyzed or the generator signal to be generated.

An optimum removal of the interference-signal spectral components is achieved by a frequency translation to the zero positions of the transmission function of the intermediate-frequency filter. In this context, a frequency translation of the interference-signal spectral lines to the nearest zero position of the transmission function takes place. Since the transmission function of the intermediate-frequency filter resembles an si-function, the maximum necessary frequency translation is restricted to half the spacing between two zero positions of this transmission function (half the frequency width of the "main lobe" of the transmission function resembling an si-function).

BRIEF DESCRIPTION OF THE DRAWINGS

An exemplary embodiment of the disclosed method and device for increasing the dynamic range and measuring accuracy of a measuring device for spectrum and/or network analysis of a high-frequency electronic signal is explained in greater detail below with reference to the drawings. The drawings are as follows.

DETAILED DESCRIPTION

Figure 1:
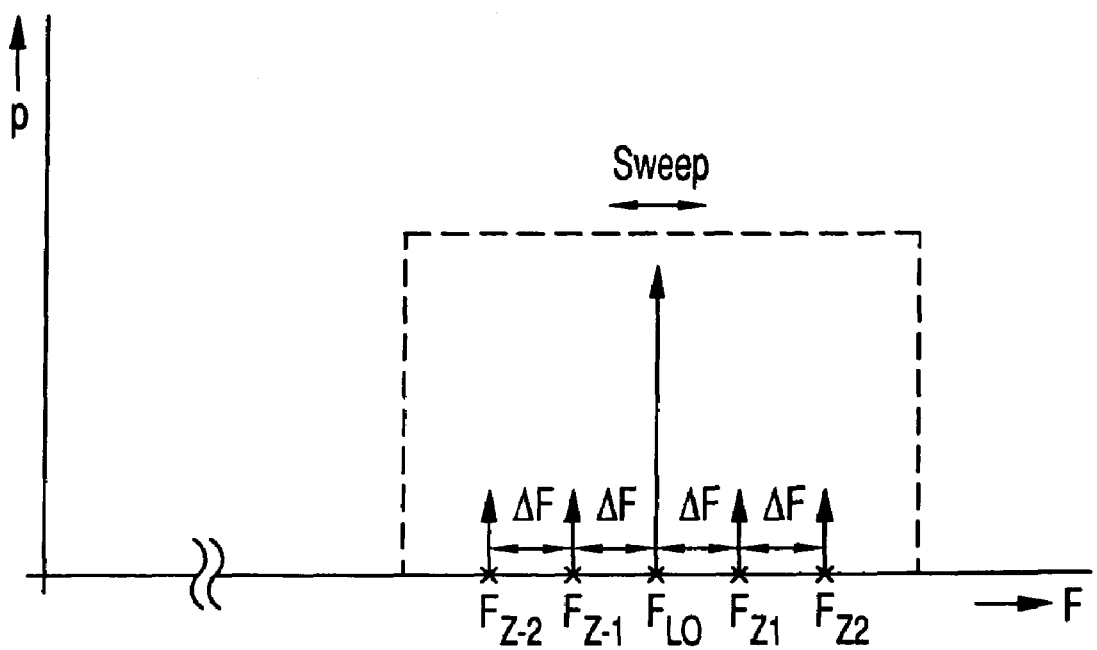
FIG. 1 shows a graphic representation of interference-signal spectral components with fixed frequency spacing relative to the "sweeping" mixer signal.
Figure 2:
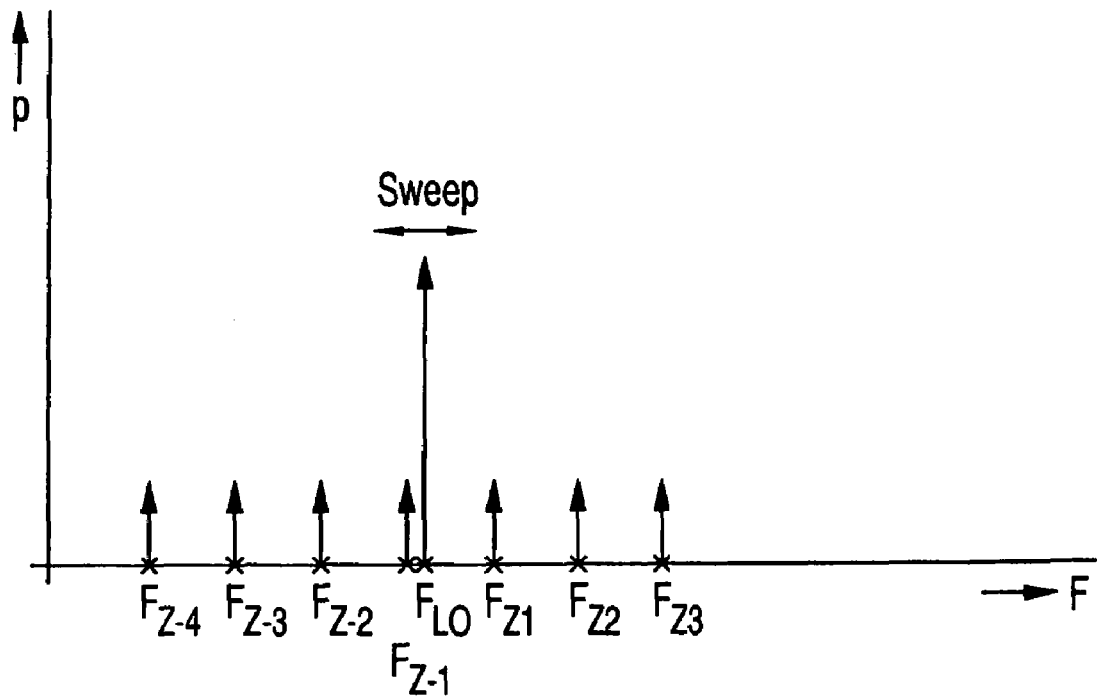
FIG. 2 shows a graphic representation of interference-signal spectral components with independent frequency spacing relative to the "sweeping" mixer signal.
Figure 3:
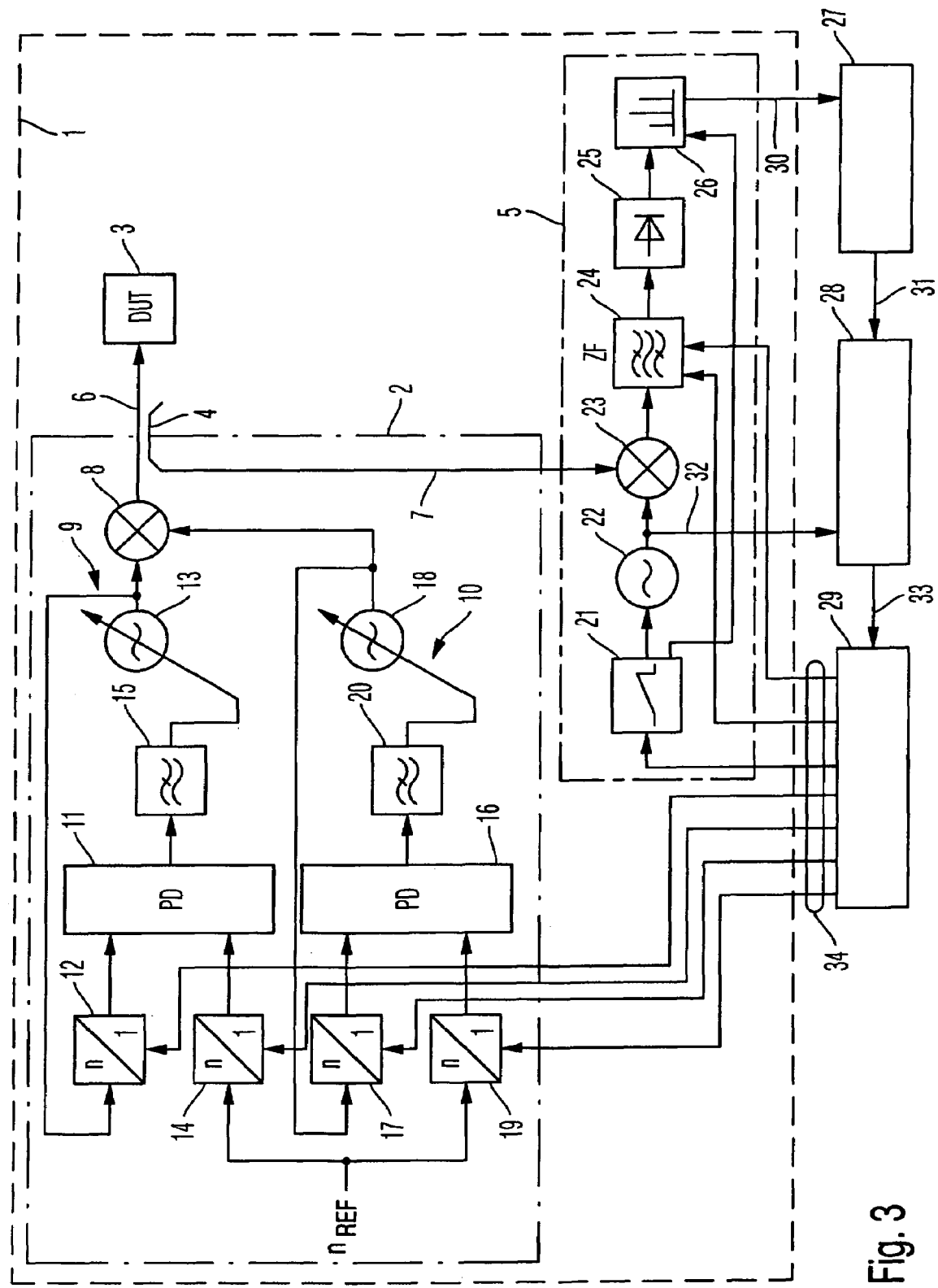
FIG. 3 shows a block circuit diagram of a device for increasing the dynamic range and the measuring accuracy of a measuring device for spectrum and/or network analysis of high-frequency electronic signals.

FIG. 3 shows a device for increasing the dynamic range and measuring accuracy of a measuring device for spectrum and/or network analysis of high-frequency electronic signals.

The measuring device 1—for example, a spectrum analyzer or network analyzer—is represented schematically in FIG. 3 being limited to essential functional units. It includes a unit 2 for generating a generator signal, a device under test (DUT) 3, a directional coupler 4 and a unit 5 for implementation of the spectrum analysis.

The device under test 3 to be measured is excited with the generator signal via a signal line 6. The generator signal or the measuring signal reflected from the device under test 3 is registered via a directional coupler arranged in the signal line 6 and supplied via a signal line 7 to the unit 5 for the implementation of the spectrum analysis.

Before it is supplied via the signal line 6 to the device under test 3, the generator signal is converted from the high-frequency range into the intermediate-frequency range via a mixer 8 with a mixer signal. For this purpose, the frequency of the high-frequency generator signal is adjusted in a first phase-control loop 9, and the frequency of the mixer signal is adjusted in a second phase-control loop 10.

In this context, the first phase-control loop 9 contains a phase detector 11, which determines the system deviation between an actual frequency value of the high-frequency generator signal at the output of a voltage-controlled frequency oscillator (VCO) 13 divided down in its frequency by the adjustable division factor n in a frequency divider 12, and a frequency reference value $m_{REF}$ divided down in its frequency by an adjustable division factor n in a frequency divider 14. A low-pass filter 15 disposed after the phase detector 11 imprints a given control dynamic on the first phase-control loop 9. The series-connected, voltage-controlled frequency oscillator 13 corrects the frequency of the high-frequency generator signal dependent upon the system deviation determined by the phase detector 11. The frequency of the high-frequency generator signal at the output of the first phase-control loop 9 is determined by the frequency division of the frequency reference value $n_{REF}$ by the division factor n of the frequency divider 12. The frequency level of the high-frequency generator signal at the output of the first phase-control loop 9 is compared with the frequency level of the frequency reference value $n_{REF}$ at the input of the first phase-control loop 9 in the voltage-controlled frequency oscillator 13.

Similarly, the second phase-control loop 10 contains a phase detector 16, which determines the deviation between an actual frequency value of the mixer signal at the output of a voltage-controlled frequency oscillator 18 divided down in its frequency by the adjustable division factor n in a frequency divider 17, and a frequency reference value nREF divided down in its frequency by an adjustable division factor n in a frequency divider 19. A low-pass filter 20 following the phase detector 16 imprints a given control dynamic onto the second phase-control loop 10. A series-connected voltage-controlled frequency oscillator 18 corrects the frequency of the mixer signal dependent upon the system deviation determined by the phase detector 16. The frequency of the mixer signal at the output of the second phase-control loop 10 is determined by the frequency division of the frequency reference value nREF by the division factor n of the frequency divider 12. The frequency level of the high-frequency mixer signal at the output of the second phase-control loop 10 is compared with the frequency level of the frequency reference value nREF at the input of the second phase-control loop in the voltage-controlled frequency oscillator 18.

In a unit 5 for the implementation of the spectrum and/or network analysis, which operates according to the principle of superimposition, a signal for frequency tuning of a local oscillator 22 is generated, according to the prior art, along a frequency ramp in a saw-tooth generator 21. The mixer signal generated by the local oscillator 22 is a variable-frequency signal, the frequency range of which is determined by the frequency ramp of the saw-tooth generator 21. A first frequency translation of the active measuring signal in the signal line 7 to the resolution bandwidth of an intermediate-frequency filter 24 following a mixer 23 takes place with the mixer signal in the subsequent mixer 23, so that the relevant frequency range of the measuring signal is displaced successively through the resolution bandwidth of an intermediate-frequency filter 24.

In a subsequent detector 25, the level of the measuring signal displaced successively in the intermediate-frequency filter 24 is determined and supplied to a display device 26, which is synchronised by the saw-tooth generator 21, for the graphic presentation.

Additionally, the disclosed device for increasing the dynamic range and the measuring accuracy of a measuring device for the spectrum and/or network analysis of an electronic high-frequency signal can contain a unit 27 for the identification of the frequencies of the spectral components of the interference signals, which are presented in the display device 26 and supplied via a signal line 30 to the unit 27 for identification of the frequencies of the spectral components of the interference signals. The identified frequencies of the spectral components of the interference signals are supplied via a signal line 31 to a unit 28 for superordinate procedural control, which determines the interference source of the interference signals, which selects the relevant frequency-translation type of the second frequency translation in each case on this basis and which determines the frequency deviation of the second frequency translation and the correct time for the relevant second frequency translation.

In order to determine the correct time for the second frequency translation, the unit 28 for superordinate procedural control registers the current frequency of the mixer signal at the output of the local oscillator 22 via a signal line 32. The relevant frequency-translation type of the second frequency translation, the relevant frequency deviation of the second frequency translation and the correct time for the second frequency translation are communicated to the unit 29 for controlling the second frequency translation via a signal line 33 from the unit 28 for superordinate procedural control. Via a signal lines 34, the unit 29 for controlling the frequency translation controls the parameters relevant for each frequency-translation type of the second frequency translation in each functional unit of the measuring device 1.

Figure 4:
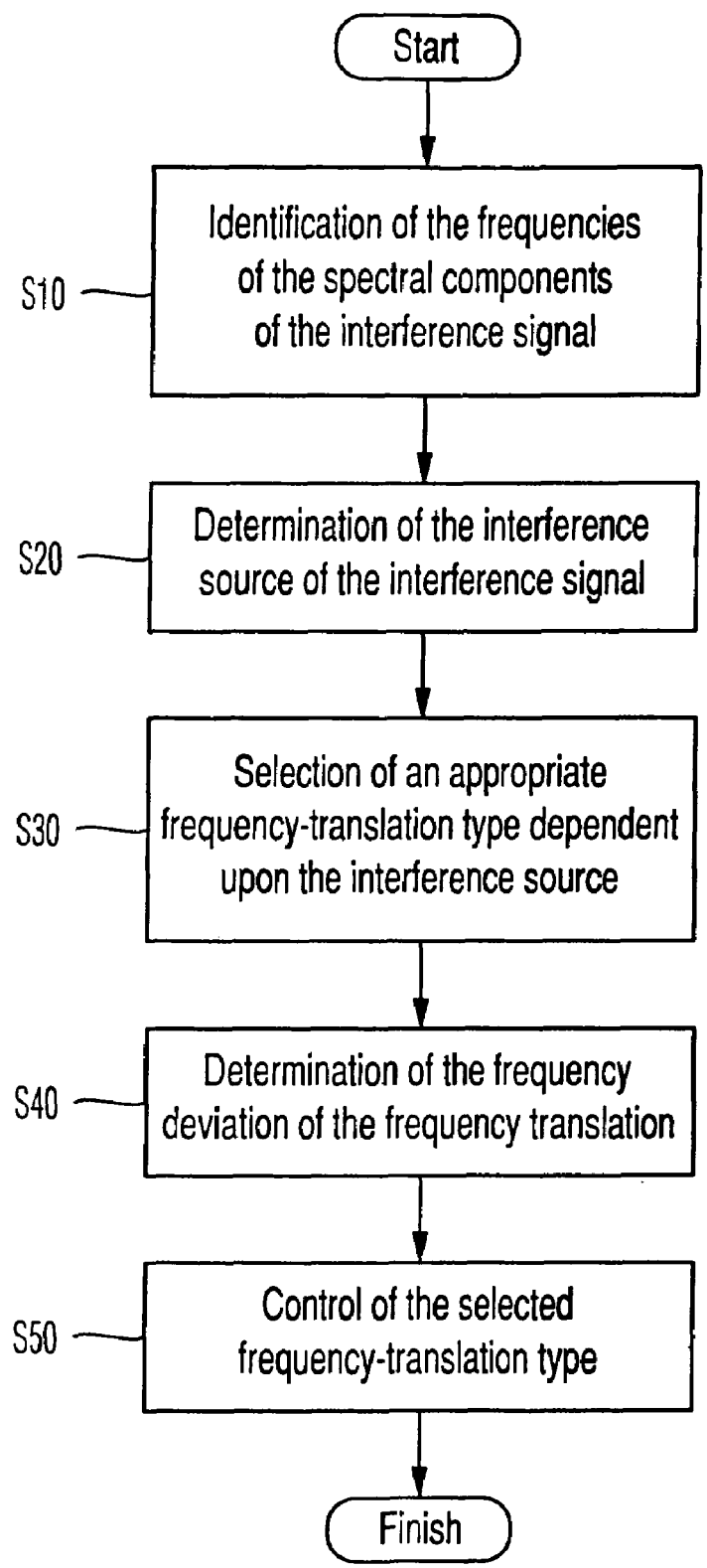
FIG. 4 shows a flow-chart for a method for increasing the dynamic range and the measuring accuracy of a measuring device for spectrum and/or network analysis of high-frequency electronic signals.

FIG. 4 shows a flow chart for the disclosed method for increasing the dynamic range and measuring accuracy of a measuring device for spectrum and/or network analysis of electronic high-frequency signals.

In the first procedural stage S10, the frequencies of the spectral components of the interference signals are determined on the basis of the results of the spectrum and/or network analysis displayed in the display device 26. In this context, in order to separate the spectral components of the interference signals from the spectral components of the measuring signal to be analyzed, the unit 5 for implementing the spectrum and/or network analysis is supplied with a standardized measuring signal with a known spectrum. After blanking out the spectral components of the standardized measuring signal from the measured results from the unit 5 for implementation of the spectrum and/or network analysis, the frequencies of the spectral components of the interference signals from the unit 27 for identification of the frequencies of the spectral components of the interference signals can be read out comparatively simply from the unit 5 for implementation of the spectrum and/or network analysis via the signal line 30.

In a subsequent procedural stage S20, the relevant interference source for each interference signal is identified. In this context, it is essentially established, whether spectral components of interference signals, which are disposed at a fixed frequency spacing relative to the mixer frequency $F_{LO}$, or spectral components of interference signals, which are disposed at frequencies fixed independently of the mixer frequency $F_{LO}$, are involved. This can be determined via the unit 27 for the identification of the frequencies of the spectral components of the interference signals by variation of the mixer frequency $F_{LO}$ and subsequent measurement of the frequency spacing of the spectral components of the interference signals relative to the mixer frequency $F_{LO}$. It is also possible to determine whether the interference signals are coupled into the signal path of the mixer signal or the signal path of the measuring and/or generator signal. By varying the frequency of the mixer signal or the frequency of a standardized measuring and/or generator signal, the frequencies of the spectral components of the identified interference signals are determined via the unit 27 for identification of frequencies of the spectral components of the interference signals, and inferences can be drawn regarding the interference sources of the interference signals from the determined frequency changes of the spectral components of the identified interference signals.

On the basis of the results of procedural stage S20, the type of the second frequency translation is determined in a subsequent procedural stage S30. In this context, the following types of second frequency translation may be involved, for example:

(1) changing the mid-frequency $F_M$ of the intermediate frequency filter 24,
(2) changing the resolution bandwidth $\Delta F_{ZF}$ of the intermediate frequency filter 24,
(3) frequency translation of the mixer frequency of the mixer 8 responsible for mixing down the generator signal by changing the division factors n of the frequency dividers 17 and 19 of the second phase-control loop 10,
(4) frequency translation of the mixer frequency $F_{LO}$ of the mixer 23 responsible for mixing down the measuring signal to be analyzed and
(5) frequency translation of the spectral lines of the interference signals by periodic switching of the division factor n of the frequency dividers 12 and 14 of the first phase-control loop 9 between two division-factor values $n_1$ and $n_2$ symmetrical to the division factor value $n_0$, which determines the average frequency of a high-frequency generator signal at the output of the first phase-control loop.

Figure 6:
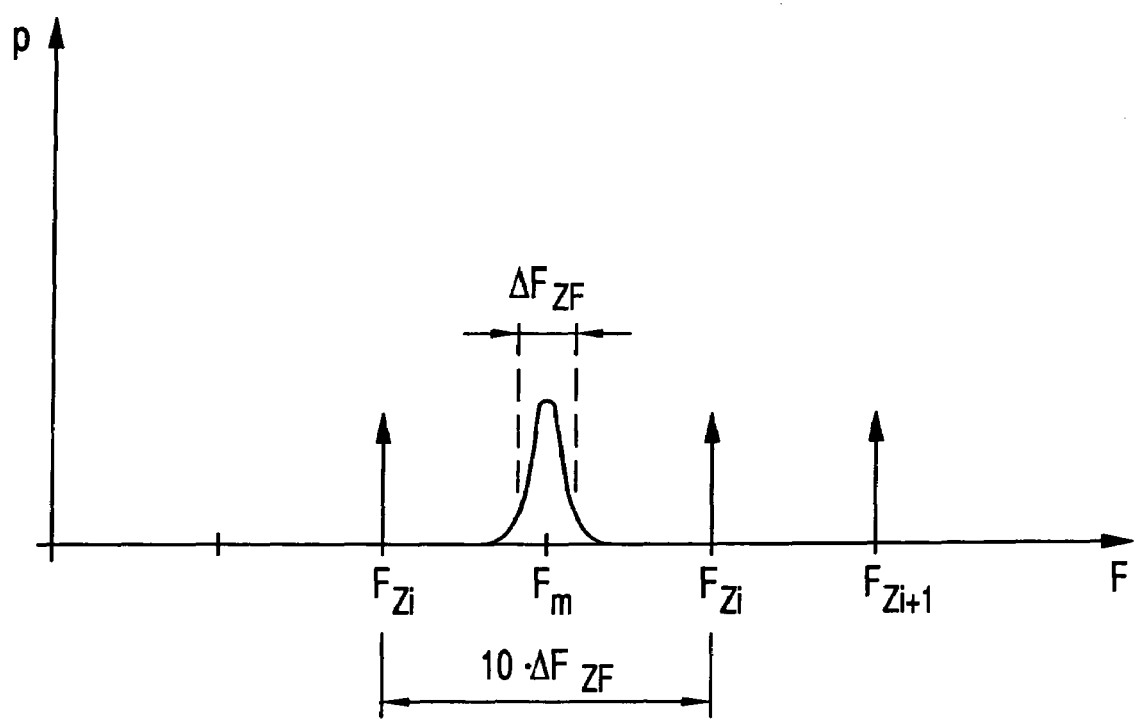
FIG. 6 shows a graphic representation of interference-signal spectral components changing periodically in frequency.

With the frequency-translation type according to (5), the spectral lines of the interference signals to be translated in each case are shifted so far outside the resolution bandwidth $\Delta F_{ZF}$ of the intermediate-frequency filter 24, that, as shown in FIG. 6, they periodically come to be disposed at the positive and negative spacing, for example, of the five-fold resolution bandwidth $\Delta F_{ZF}$ of the intermediate frequency filter 24 relative to the mid-frequency $F_M$ of the intermediate frequency filter 24, and are accordingly disposed outside the relevant resolution range of the unit 5 for implementation of the spectrum and/or network analysis.

In the subsequent procedural stage S40, the necessary frequency deviation of the second frequency translation is determined. In the case of a general application, dependent upon the frequencies of the interference-signal spectral components determined in procedural stage S10 and the resolution bandwidth $\Delta F_{ZF}$ of the intermediate-frequency filter 24 relative to the mid-frequency $F_M$ of the intermediate frequency filter 24, a frequency deviation is determined for the second frequency translation of a magnitude such that the interference-signal spectral components come to be disposed at a sufficiently remote frequency spacing—for example, five-times the resolution bandwidth $\Delta F_{ZF}$ of the intermediate frequency filter 24—relative to the mid-frequency $F_M$ of the intermediate frequency filter 24.

Figure 5:
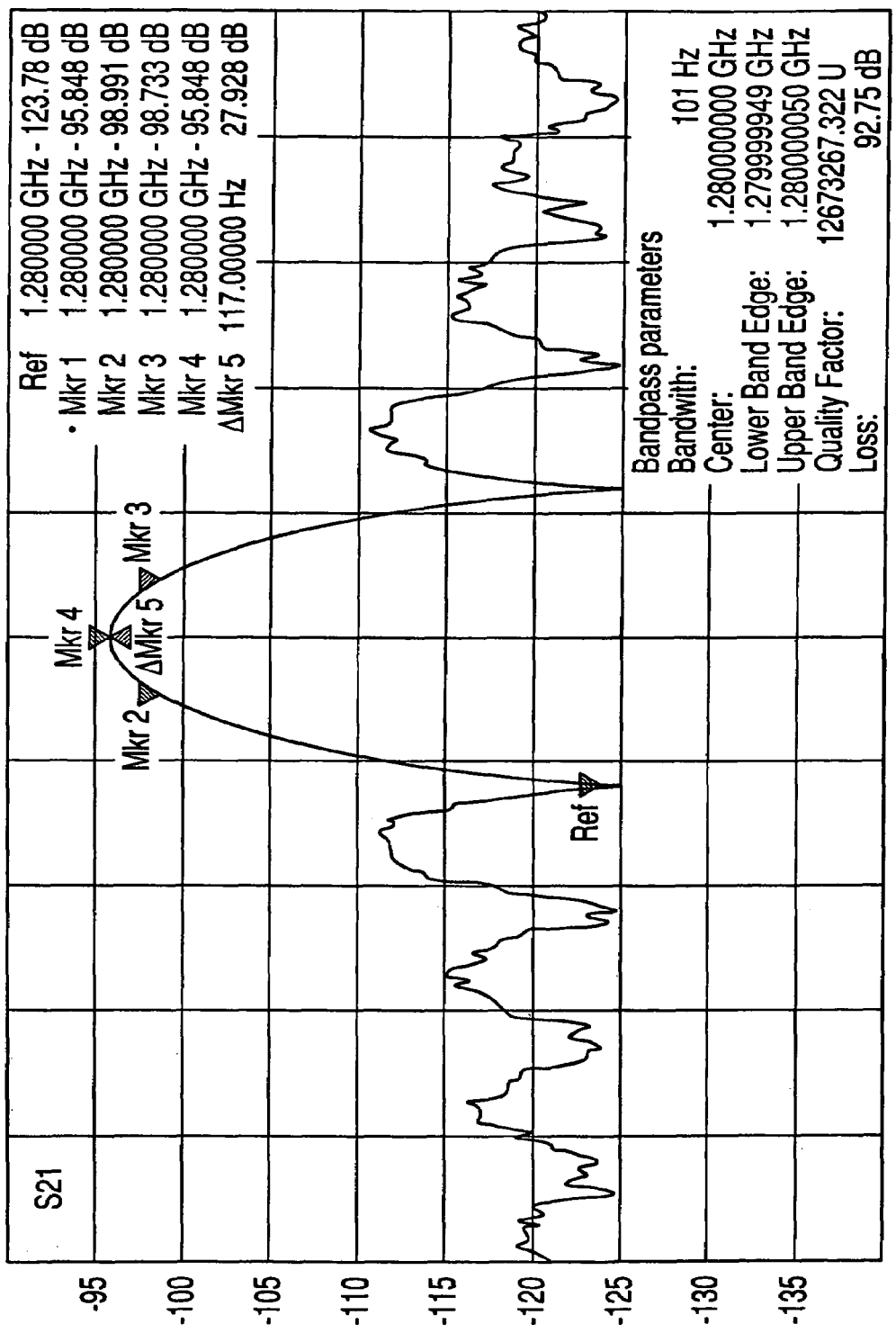
FIG. 5 shows a spectral representation of the transmission function of the intermediate-frequency filter.

In the case of the preferred application, the frequency deviation of the second frequency translation is selected in such a manner that each spectral line of the interference signal comes to be disposed at the zero position of the transmission function of the intermediate-frequency filter 24 disposed nearest to the original spectral frequency of the spectral line of the interference signal. Since the transmission function of the intermediate-frequency filter 24 according to FIG. 5 involves a transmission function similar to an si-function, the maximum frequency deviation of the second frequency translation to be implemented, with an original frequency position of the interference-signal spectral components within the resolution bandwidth $\Delta F_{ZF}$ of the intermediate frequency filter 24—in FIG. 5, for example, $F_M \pm 0.5 \cdot \Delta F_{ZF} = 1.28$ GHz±120 Hz—is restricted to half the spacing of the two zero positions of the transmission function. If an interference-signal spectral component is not originally disposed in the "Main lobe" but in one of the "subsidiary lobes" of the transmission function of the intermediate-frequency filter 24, an attenuation of the interference-signal spectral component is also possible in this case through a second frequency translation, by means of which the interference-signal spectral component comes to be disposed in the zero position nearest to the "subsidiary lobe" of the transmission function similar to an si-function. The procedure in the case of active—variable—intermediate-frequency bandwidth $\Delta F_{ZF}$ and with the occurrence of interference-signal spectral components in the mirror frequency range, if this has not already been suppressed, should be treated in a similar manner.

In a final procedural stage S50, starting from the frequency-translation type selected in the previous procedural stage S30 and the frequency deviation of the second frequency translation determined in the preceding procedural stage S40 by the unit 29 for controlling the second frequency translations, the parameters relevant for each of the second frequency translations of the relevant functional units of the measuring device 1 to be controlled, are controlled via the signal lines 34. The time of the second frequency translation is set on the basis of the sweeping-procedure of the unit 5 for the implementation of the spectrum analysis, when the respective spectral line of the interference signal enters the proximity of the resolution bandwidth $\Delta F_{ZF}$ of the intermediate frequency filter 24. This time is determined by the unit 28 for the superordinate procedural control from the knowledge of the frequency position of the relevant spectral line of the interference signal with a given sweep-frequency of the local oscillator 22, which is determined by the unit 27 for identification of the frequencies of the spectral components of the interference signals in procedural stage S10, and the current sweep-frequency $F_{LO}$ of the local oscillator 22 determined via the signal line 32 and communicated in a time-synchronous manner to the unit 29 for the control of the second frequency translations.

The disclosure is not restricted to the embodiment presented above. In particular, additional frequency-translation types for the second frequency translations, which are not described here but which are used with other interference sources for interference signals in measuring devices for spectrum analysis of high-frequency electronic signals not discussed in the present document, can be taken into consideration by the disclosure.

| Key to diagrams FIG. 4 | |
|---|---|
| Start | Start |
| S10 Identifizieren der Frequenzen der Spektralanteile des Störsignals | Identification of the frequencies of the spectral components of the interference signal |
| S20 Bestimmung der Störquelle des Störsignals | Determination of the interference source of the interference signal |
| S30 Auswahl einer geeigneten Frequenzverschiebungs-Typs in Abhängigkeit der Störquelle | Selection of an appropriate frequency-translation type dependent upon the interference source |
| S40 Bestimmung des Frequenzhubs der Frequenzverschiebung | Determination of the frequency deviation of the frequency translation |
| S50 Ansteuerung des ausgewählten Frequenzverschiebungs-Typs | Control of the selected frequency-translation type |
| Ende | Finish |

The invention claimed is:

1. A device for increasing the dynamic range and measuring accuracy of a measuring device for spectrum analysis and/or network analysis of a high-frequency electronic signal within a frequency range comprising:

a first mixer and first local oscillator adapted to perform a first frequency translation by imaging a high-frequency electronic signal of the measuring device successively into a resolution bandwidth of an intermediate filter of the measuring device, a detector that detects levels of the imaged spectrum signal;

a display device for displaying the levels of the imaged spectrum signal;

a first unit for controlling a second frequency translation;

a second unit for identifying the frequencies of the spectral lines of interference signals that are generated in the measuring device;

a third unit for superordinate procedural control for selecting a second frequency translation based on the identified frequencies of the spectral lines;

a generator for producing a generator signal that is applied to a device under test, wherein the generator signal is produced by a second mixer having a second and third local oscillator as inputs to the second mixer; and a directional coupler for registering a feedback signal from the applied generator signal, wherein the feedback signal is the high-frequency electronic signal imaged by the first mixer.

2. The device of claim 1, wherein the second unit determines an interference source of the interference signals and the third unit for superordinate procedural control selects a second frequency translation based on the identified frequencies of the spectral lines and the determined interference source.

3. The device of claim 1, wherein the third unit selects a second frequency translation type, a frequency deviation for the second frequency translation, and a correct time for the second frequency translation based on the frequencies identified by the second unit.

4. The device of claim 1, wherein selecting a second frequency translation based on the identified frequencies comprises selecting a frequency translation type comprising altering the one of the frequencies of the first or second local oscillators inputted into the second mixer.

* * * * *